US010942674B2

(12) United States Patent
Lee

(10) Patent No.: US 10,942,674 B2
(45) Date of Patent: Mar. 9, 2021

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Hyeng Ouk Lee, Gyeonggido (KR)

(73) Assignee: SK hynix Inc., Gyeonggi-do (KR)

( * ) Notice: Subject to any disclaimer, the term of this patent is extended or adjusted under 35 U.S.C. 154(b) by 186 days.

(21) Appl. No.: 16/050,018

(22) Filed: Jul. 31, 2018

(65) Prior Publication Data

US 2019/0187933 A1 Jun. 20, 2019

(30) Foreign Application Priority Data

Dec. 20, 2017 (KR) .................... 10-2017-0176239

(51) Int. Cl.
| | |
|---|---|
| G06F 11/00 | (2006.01) |
| G06F 3/06 | (2006.01) |
| G06F 11/20 | (2006.01) |
| G11C 29/00 | (2006.01) |

(52) U.S. Cl.
CPC .......... *G06F 3/0659* (2013.01); *G06F 3/0619* (2013.01); *G06F 3/0631* (2013.01); *G06F 3/0679* (2013.01); *G06F 11/2094* (2013.01); *G11C 29/00* (2013.01); *G06F 2201/82* (2013.01)

(58) Field of Classification Search
CPC ............ G06F 11/1068; G06F 11/1666; G06F 11/0727; G06F 11/073; G06F 11/008; G06F 11/2053; G06F 11/2084; G06F 11/2094; G06F 11/1092; G06F 11/16; G06F 11/1612; G06F 11/1084; G06F 11/1088

USPC ........................................................ 714/6.13
See application file for complete search history.

(56) References Cited

U.S. PATENT DOCUMENTS

| | | | | |
|---|---|---|---|---|
| 2002/0049943 A1* | 4/2002 | Kobayashi | ....... | G01R 31/31813 714/734 |
| 2005/0050410 A1* | 3/2005 | Pomaranski | ........... | G11C 29/56 714/723 |
| 2008/0059817 A1* | 3/2008 | Kuwahara | ............. | G06F 1/3203 713/300 |
| 2008/0244159 A1* | 10/2008 | Miyamoto | ............ | G06F 7/5306 711/100 |
| 2009/0158224 A1* | 6/2009 | Barth, Jr. | ............... | G11C 29/24 716/136 |
| 2011/0173412 A1* | 7/2011 | Tabei | .................. | G06F 12/1441 711/213 |
| 2013/0193993 A1* | 8/2013 | Golov | ............. | G01R 31/31907 324/750.01 |

(Continued)

FOREIGN PATENT DOCUMENTS

| | | |
|---|---|---|
| KR | 1020160138766 | 12/2016 |
| KR | 1020170058022 | 5/2017 |

(Continued)

*Primary Examiner* — Sarai E Butler
(74) *Attorney, Agent, or Firm* — IP & T Group LLP

(57) ABSTRACT

A semiconductor device and a semiconductor system including the same are disclosed. The semiconductor system includes a first semiconductor device having a memory region, the first semiconductor device configured to output reliability information of the memory region to an external part, and a second semiconductor device configured to control the first semiconductor device based on the reliability information.

20 Claims, 11 Drawing Sheets

(56) References Cited

U.S. PATENT DOCUMENTS

| | | | | |
|---|---|---|---|---|
| 2014/0380136 A1* | 12/2014 | Ok | ................. | G06F 11/1004 |
| | | | | 714/807 |
| 2015/0333759 A1* | 11/2015 | Jung | ................. | H03L 7/083 |
| | | | | 327/158 |
| 2015/0363258 A1* | 12/2015 | Shin | ................. | G06F 11/0793 |
| | | | | 714/3 |
| 2016/0259675 A1* | 9/2016 | Ninose | ................. | G11C 29/76 |
| 2017/0160039 A1* | 6/2017 | Frederick | ................. | F41A 29/02 |
| 2017/0160339 A1* | 6/2017 | Jenkins | ................. | G01R 31/2882 |
| 2017/0350938 A1* | 12/2017 | Kang | ................. | H03K 3/0315 |
| 2018/0121312 A1* | 5/2018 | Sadowski | ................. | G06F 11/3452 |
| 2018/0218878 A1* | 8/2018 | Xu | ................. | H01J 37/31 |
| 2019/0034252 A1* | 1/2019 | Fletcher | ................. | G06F 11/0712 |

FOREIGN PATENT DOCUMENTS

| KR | 1020170062624 | 6/2017 |
|---|---|---|
| KR | 1020170066082 | 6/2017 |

* cited by examiner

| DEG | CMP | OPERATION FREQUENCY | OPERATION SCHEME |
|---|---|---|---|
| REF1~REF2 | 0 | F1 | DDR |
| REF2~REF3 | 0 | F2 | SDR |
| ⋮ | ⋮ | ⋮ | ⋮ |
| REFm~REFm+1 | 1 | Fm | SDR |
| ⋮ | ⋮ | ⋮ | ⋮ |
| REFk-1~REFk | 0 | Fk-1 | SDR |

FIG.6

SEMICONDUCTOR DEVICE AND SEMICONDUCTOR SYSTEM INCLUDING THE SAME

CROSS-REFERENCE TO RELATED APPLICATION

This application claims priority based upon Korean patent application No. 10-2017-0176239, filed on Dec. 20, 2017, the disclosure of which is hereby incorporated in its entirety by reference herein.

BACKGROUND OF THE INVENTION

Embodiments of the present disclosure generally relate to a semiconductor device and a semiconductor system including the same. Particularly, the embodiments relate to a technology for generating specific information in a semiconductor device and transmitting the specific information to external device(s).

A semiconductor device including a memory is combined with a processor, for example, a Central Processing Unit (CPU), an Application Processor (AP), or a Graphics Processing Unit (GPU), such that the resultant semiconductor device is widely used in various fields. Defects or faults may occur in parts in a fabrication process of the semiconductor device, or the semiconductor device may be deteriorated in a product usage process, resulting in reduced reliability of the semiconductor device.

Guaranteeing reliability of the semiconductor device is of importance to proper operation of the processor.

BRIEF SUMMARY OF THE INVENTION

Various embodiments of the present disclosure are directed to providing a semiconductor device and a semiconductor system including the same that substantially obviate one or more problems due to limitations and disadvantages of the related art.

An embodiment of the present disclosure relates to a technology for allowing a semiconductor device to provide its own reliability information, resulting in guarantee of reliability of the semiconductor device.

In accordance with an embodiment of the present disclosure, a semiconductor system includes a first semiconductor device having a memory region, the first semiconductor device configured to output reliability information of the memory region to an external part, and a second semiconductor device configured to control the first semiconductor device based on the reliability information.

In accordance with another embodiment of the present disclosure, a semiconductor device includes a memory region; and a reliability measurement circuit configured to measure reliability of the memory region, and output the measured reliability information to an external part.

In accordance with another embodiment of the present disclosure, a semiconductor device includes a memory region; a failed address detector configured to detect at least one failed address of the memory region, and output the detected at least one failed address to an external part; a warning signal generator configured to generate a warning signal based on the number of the at least one failed address, and output the warning signal to an external part; and a degradation detector configured to detect a degree of degradation of the memory region, and output degradation information, which is indicative of the degree of degradation of the memory region, to an external part.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein:

FIG. 6 is a conceptual diagram illustrating operations of an operation speed controller according to an embodiment of the present disclosure.

DESCRIPTION OF EMBODIMENTS

References will now be made in detail to various embodiments of the present disclosure, aspects and features of which are illustrated in the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Wherever possible, the same reference numbers are used throughout the drawings to refer to the same or like parts. Throughout the disclosure, when reference is made to "an embodiment," such reference does not necessarily mean only one embodiment. Moreover, different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Figure 1:
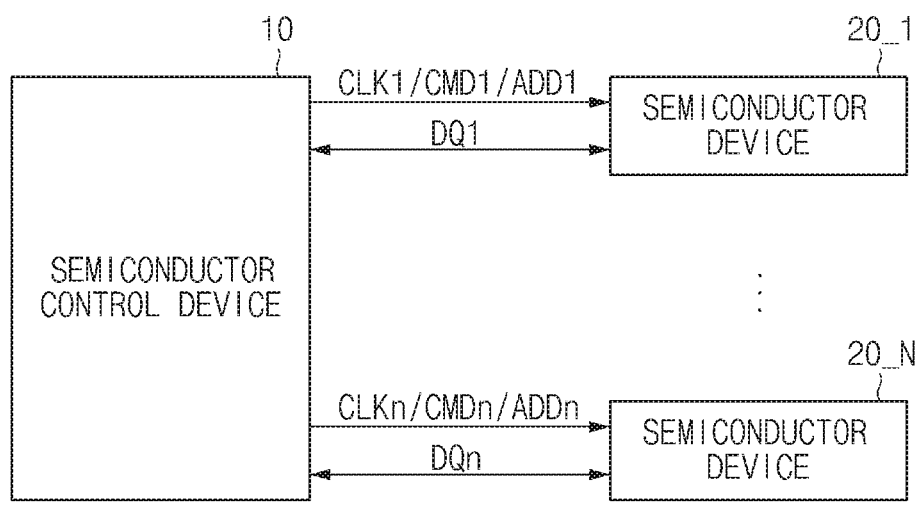
FIG. 1 is a diagram illustrating a semiconductor system according to an embodiment of the present disclosure.

FIG. 1 is a diagram illustrating a semiconductor system 1 according to an embodiment of the present disclosure.

Referring to FIG. 1, the semiconductor system 1 may include a semiconductor control device 10 and one or more semiconductor devices 20_1 to 20_N (where N is a natural number). The semiconductor control device 10 may be a master device for controlling the semiconductor devices 20_1 to 20_N to perform a specific operation. The semiconductor devices 20_1 to 20_N may be slave devices configured to perform a specific operation under control of the semiconductor device 10. For example, the semiconductor control device 10 may be a central processing unit (CPU), a graphics processing unit (GPU), or an application processor (AP). For example, each of the semiconductor devices 20_1 to 20_N may be a volatile memory such as a DRAM or a non-volatile memory such as a NAND flash.

The semiconductor control device 10 may transmit clock signals CLK1 to CLKn, command signals CMD1 to CMDn, and address signals ADD1 to ADDn to the semiconductor devices 20_1 to 20_N. The semiconductor control device 10 and the semiconductor devices 20_1 to 20_N may transmit and receive data signals DQ1 to DQn. The data signals DQ1 to DQn transmitted from the semiconductor devices 20_1 to 20_N to the semiconductor control device 10 may include reliability information, which will be described later in more detail.

Figure 2:
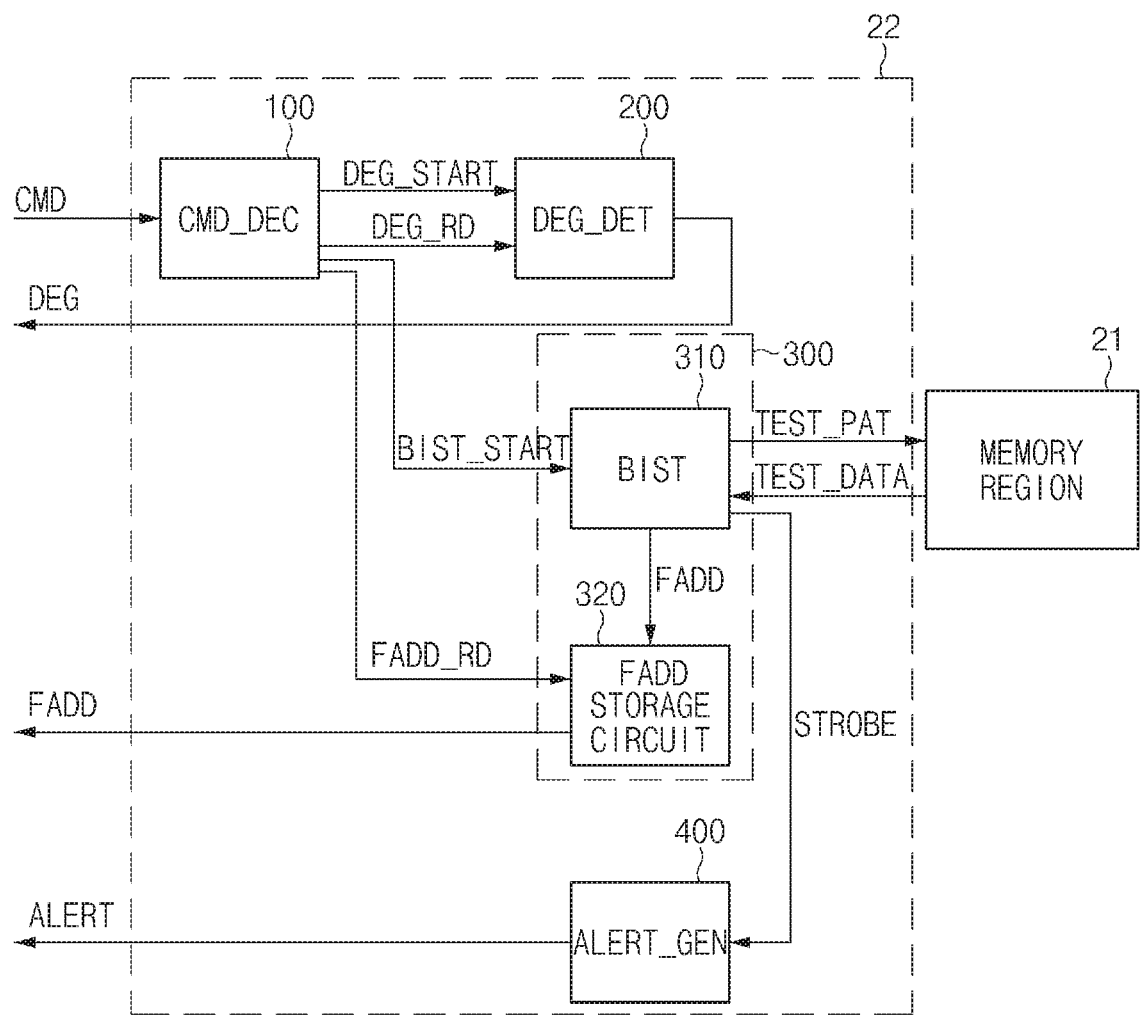
FIG. 2 is a diagram illustrating a semiconductor device according to an embodiment of the present disclosure.

FIG. 2 is a diagram illustrating a semiconductor device 20 according to an embodiment of the present disclosure. The semiconductor device 20 may represent the semiconductor devices 20_1 to 20_N of FIG. 1.

Referring to FIG. 2, the semiconductor device 20 may include a memory region 21 and a reliability measurement circuit 22.

The memory region 21 may include a memory having a plurality of memory cells arranged in an array. For example, the memory contained in the memory region 21 may be a Dynamic Random Access Memory (DRAM).

The reliability measurement circuit 22 may detect reliability information of the memory region 21 upon receiving a command signal (CMD) from the semiconductor control device 10. The reliability information may include at least one of degradation information (DEG), failed address (FADD), and a warning signal (ALERT). The degradation information (DEG), the failed address (FADD), and the warning signal (ALERT) may correspond to data signals DQ1 to DQn of FIG. 1. The reliability measurement circuit 22 may include an internal command generator (COM_DEC) 100, a degradation detector (DEG_DET) 200, a failed address detector 300, and a warning signal generator (ALERT_GEN) 400.

The internal command generator 100 may generate a degradation detection start signal (DEG_START), a degradation read signal (DEG_RD), a self-test start signal (BIST_START), and a failed address read signal (FADD_RD) upon receiving the command signal (CMD) from the semiconductor control device 10. The command signal (CMD) may include a plurality of bits. The internal command generator 100 may be a decoder for generating or activating at least one of the degradation detection start signal (DEG_START), the degradation read signal (DEG_RD), the self-test start signal (BIST_START), and the failed address read signal (FADD_RD) according to a combination of levels of the bits of the command signal (CMD).

The degradation detector 200 may detect the degree of degradation of the memory region 21 in response to the degradation detection start signal (DEG_START), and may output degradation information (DEG) in response to the degradation read signal (DEG_RD).

The failed address detector 300 may test the memory region 21 in response to the self-test start signal (BIST_START), may detect the failed address (FADD), and may output the failed address (FADD) in response to the failed address read signal (FADD_RD). The failed address detector 300 may activate a strobe signal (STROBE) whenever the failed address (FADD) is detected. The failed address detector 300 may include a built-in self-test circuit 310 and a failed address storage circuit 320.

The built-in self-test circuit 310 may test the memory region 21 in response to the self-test start signal (BIST_START), and may thus detect the failed address (FADD). The built-in self-test circuit 310 may activate the strobe signal (STROBE) when detecting the failed address (FADD).

When the built-in self-test circuit 310 generates a test pattern (TEST_PAT) and transmits the test pattern (TEST_PAT) to the memory region 21, the memory region 21 may transmit test data (TEST_DATA) on the basis of the test pattern (TEST_PAT). The built-in self-test circuit 310 may detect the failed address (FADD) on the basis of the test data (TEST_DATA). For example, the built-in self-test circuit 310 may generate the test pattern (TEST_PAT) in response to the self-test start signal (BIST_START), and may write the test pattern (TEST_PAT) in the memory region 21. Thereafter, the built-in self-test circuit 310 may read the test data (TEST_DATA) from an address of the memory region 21 in which the test pattern (TEST_PAT) is written, and may compare the test pattern (TEST_PAT) with the read test data (TEST_DATA). When the test pattern (TEST_PAT) is not identical to the read test data (TEST_DATA), the address in which the test pattern (TEST_PAT) is written may be detected as the failed address (FADD).

The failed address storage circuit 320 may store the failed address (FADD) detected from the built-in self-test circuit 310, and may output the failed address (FADD) in response to the failed address read signal (FADD_RD). The failed address storage circuit 320 may be a latch circuit.

The warning signal generator 400 may generate the warning signal (ALERT) according to the result of counting the strobe signal (STROBE). The warning signal generator (ALERT_GEN) may activate the warning signal (ALERT) when the count value of the strobe signals (STROBE) is equal to or higher than a predetermined value.

Figure 3:
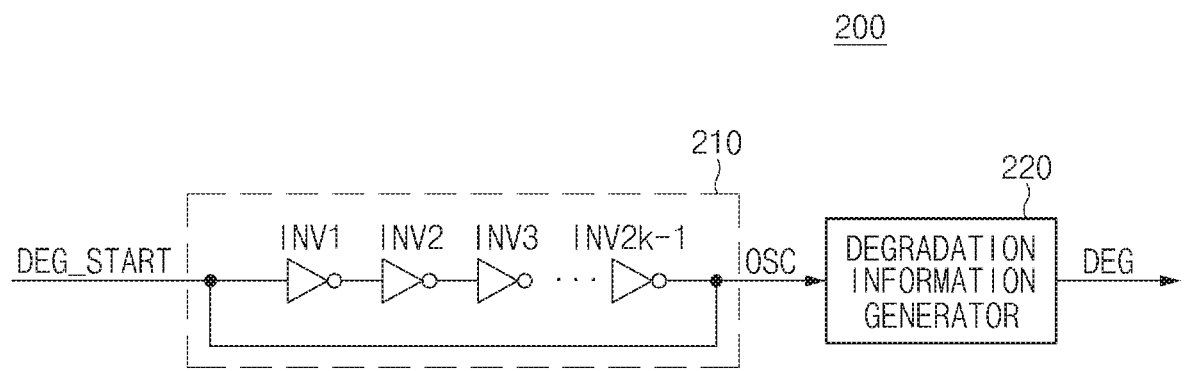
FIG. 3 is a circuit diagram illustrating a degradation detector according to an embodiment of the present disclosure.

FIG. 3 is a circuit diagram illustrating the degradation detector 200 according to an embodiment of the present disclosure.

Referring to FIG. 3, the degradation detector 200 may include a ring oscillator 210 and a degradation information generator 220.

The ring oscillator 210 may output an oscillation signal (©SC) in response to the degradation detection start signal (DEG_START). The ring oscillator 210 may include odd inverters INV1 to INV2k−1 connected in a ring shape. Each of the inverters INV1 to INV2k−1 may invert an output signal of a previous stage, and may output the inverted signal to a next stage.

When the degradation detection start signal (DEG_START) is activated to a high level, the first inverter INV1 may output a low-level signal. The second inverter INV2 may receive the low-level signal, and may thus output a high-level signal. In this way, the resultant signal may enter the last inverter INV2k−1 after passing through the other inverters, and a high-level signal is input to the last inverter INV2k−1, such that the ring oscillator 210 may output a low-level signal. That is, the ring oscillator 210 may output the low-level signal in a first cycle.

The low-level signal generated from the last inverter INV2k−1 may be input to the first inverter INV1. The first inverter INV1 may receive the low-level signal, and may thus output a high-level signal. The second inverter INV2 may receive a high-level signal, and may thus output a low-level signal. In this way, the resultant signal may enter the last inverter INV2k−1 after passing through the other inverters, and a low-level signal is input to the last inverter INV2k−1, such that the ring oscillator 210 may output a high-level signal. That is, the ring oscillator 210 may output the high-level signal in a second cycle.

As described above, the ring oscillator 210 may output a low-level signal in a third cycle, may output a high-level signal in a fourth cycle, and may thus output the oscillation signal (OSC).

The degradation information generator 220 may count a number of oscillations of the oscillation signal (OSC), and may generate/output degradation information (DEG) according to the counted value of the oscillation signal (OSC) in response to the degradation read signal (DEG_RD). The degradation information generator 220 may include a counter configured to count the number of oscillations of the oscillation signal (OSC).

Constituent elements (e.g., a plurality of inverters) of the ring oscillator 210 may change in delay according to the degree of degradation. Therefore, it may be possible to recognize the degree of degradation according to the count value of the outputted oscillation signal (OSC) during a unit time.

Figure 4:
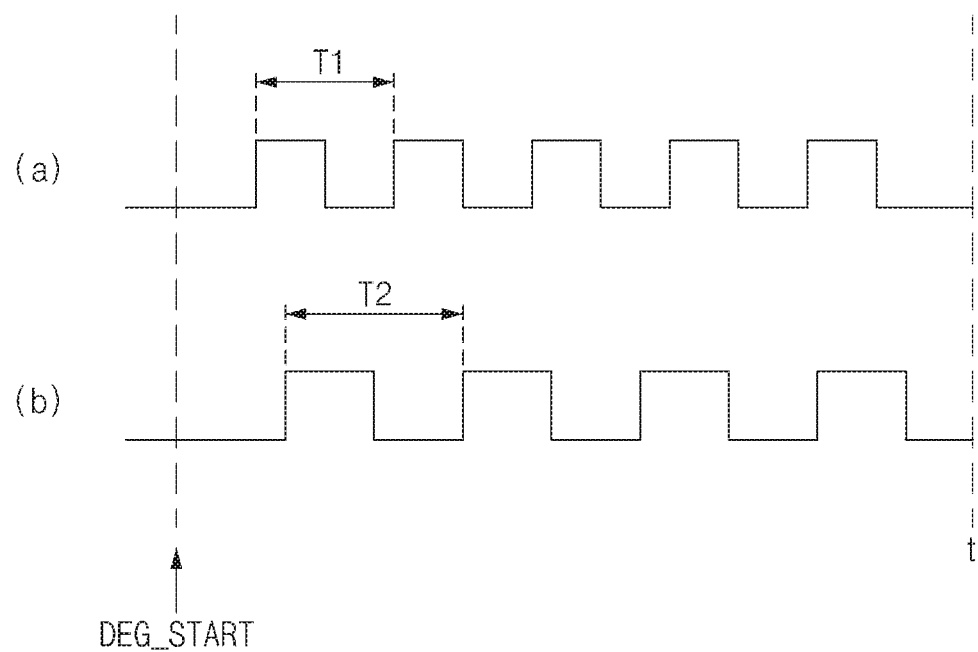
FIG. 4 shows waveform diagrams of oscillation signals according to embodiments of the present disclosure.

FIG. 4 shows waveform diagrams of oscillation signals (OSC) according to embodiments of the present disclosure. A time period T1 of the oscillation signal (OSC) shown in (a) of FIG. 4 may be shorter than a time period T2 of the oscillation signal (OSC) shown in (b) of FIG. 4.

The inverters INV1 to INV2k−1 constructing the ring oscillator 210 may have different delays according to the degree of degradation. For example, when the degree of degradation is low, each of the inverters INV1 to INV2k−1 may have a short delay. When the degree of degradation is high, each of the inverters INV1 to INV2k−1 may have a long delay. When each of the inverters INV1 to INV2k−1 has a short delay, a signal transmission time ranging from the first inverter INV1 to the last inverter INV2k−1 is short, such that each of the oscillation signals (OSC) has a shorter time period. In contrast, when each of the inverters INV1 to INV2k−1 has a long delay, a signal transmission time ranging from the first inverter INV1 to the last inverter INV2k−1 is long, such that each of the oscillation signals (OSC) has a longer time period. Therefore, (a) of FIG. 4 illustrates a case in which the ring oscillator 210 has a low degree of degradation, and (b) of FIG. 4 illustrates another case in which the ring oscillator 210 has a high degree of degradation.

At a time point 't', the count value of the oscillation signal (OSC) shown in (a) of FIG. 4 is set to 5. At the time point 't', the count value of the oscillation signal (OSC) shown in (b) of FIG. 4 is set to 4. When the count value of the oscillation signal (OSC) is high, the degradation information generator 220 may output low-level degradation information (DEG). When the count value of the oscillation signal (OSC) is low the degradation information generator 220 may output high-level degradation information (DEG).

Figure 5:
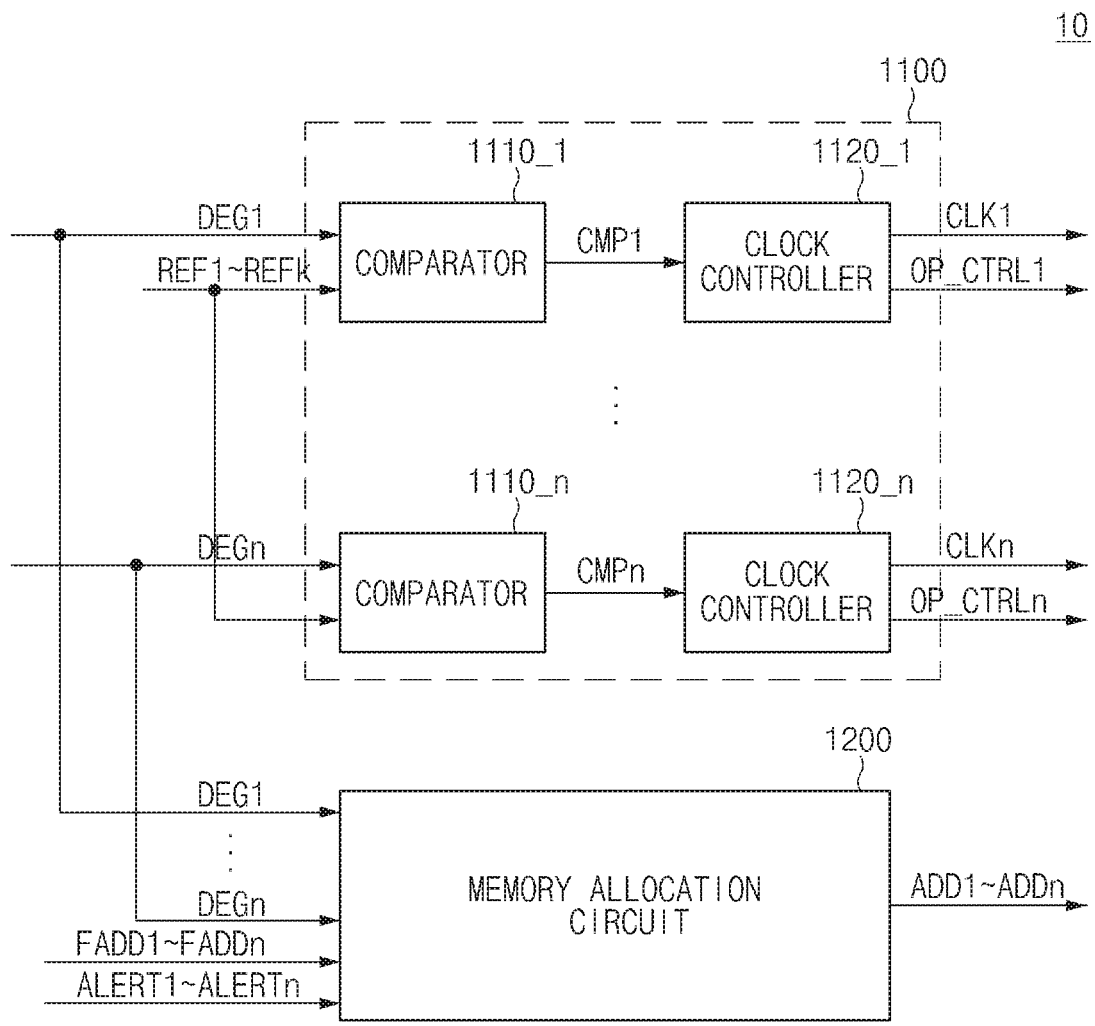
FIG. 5 is a block diagram illustrating a semiconductor control device according to an embodiment of the present disclosure.

FIG. 5 is a block diagram illustrating the semiconductor control device 10 according to an embodiment of the present disclosure.

Referring to FIG. 5, the semiconductor control device 10 may include an operation speed controller 1100 and a memory allocation circuit 1200.

The operation speed controller 1100 may adjust or regulate the operation speed of the semiconductor devices 20_1 to 20_N in response to degradation information (DEG1 to DEGn) received from the semiconductor devices 20_1 to 20_N. The operation speed controller 1100 may control frequencies of clock signals (CLK1 to CLKn) of the semiconductor devices 20_1 to 20_N as the operation speed, or may decide which one of the schemes of Single Data Rate (SDR) and Double Data Rate (DDR) to use to operate the semiconductor devices 20_1 to 20_N.

The operation speed controller 1100 may include comparators 1110_1 to 1110_n and clock controllers 1120_1 to 1120_n. The comparators 1110_1 to 1110_n may compare degradation information (DEG1 to DEGn) received from the respective semiconductor devices 20_1 to 20_N with at least one reference value (REF1 to REFk), and may respectively generate comparison signals (CMP1 to CMPn).

The clock controller 1120 may generate clock signals (CLK1 to CLKn) having frequencies based on the comparison signals (CMP1 to CMPn). The clock controller 1120 may generate operation control signals (OP_CTRL1 to OP_CTRLn) indicating whether the semiconductor devices 20_1 to 20_N will operate based on one of the SDR and DDR schemes upon receiving the comparison result signals (CMP1 to CMPn). The operation control signals (OP_CTRL1 to OP_CTRLn) may correspond to command signals (CMD1 to CMDn) shown in FIG. 1.

The memory allocation circuit 1200 may allocate memory regions 21_1 to 21_n in response to at least one of degradation information (DEG1 to DEGn), failed addresses (FADD1 to FADDn), and warning signals (ALERT1 to ALERTn). The memory allocation circuit 1200 may generate address signals (ADD1 to ADDn) on the basis of the allocation result. In this case, each of the memory regions 21_1 to 21_n may denote the memory region 21 contained in each of the semiconductor devices 20_1 to 20_N. The memory allocation circuit 1200 may control data not to be stored in storage locations corresponding to the failed addresses (FADD1 to FADDn). Upon receiving the warning signals (ALERT1 to ALERTn), the memory allocation circuit 1200 may block the semiconductor devices 20_1 to 20_N in a manner that data is not stored in the semiconductor devices 20_1 to 20_N having transmitted the corresponding warning signals (ALERT1 to ALERTn). The memory allocation circuit 1200 may store different kinds of data in the semiconductor devices 20_1 to 20_N in response to degradation information (DEG1 to DEGn) of the semiconductor devices 20_1 to 20_N. For example, when data has a high level of importance, the memory allocation circuit 1200 may store data in the semiconductor device having a low degree of degradation. When data has a low level of importance, the memory allocation circuit 1200 may store data in the semiconductor device having a high degree of degradation. For example, data having a high level of importance in the semiconductor system 1 for use in vehicles, such as automobiles, may be data associated with vehicle driving, and data having a low level of importance in the semiconductor system 1 for use in vehicles may be data associated with infotainment.

FIG. 6 is a conceptual diagram illustrating operations of the operation speed controller 1100 according to an embodiment of the present disclosure. The operation speed controller 1100 shown in FIG. 6 may represent the operation speed controllers 1100_1 to 1100_n shown in FIG. 5.

Referring to FIG. 6, the clock frequencies and the operation schemes may be pre-established according to the range of degradation information (DEG). In FIG. 6, when the degradation information (DEG) is in the range from the first reference value (REF1) to the second reference value (REF2), the degradation information (DEG) may correspond to a clock frequency (F1) and the DDR scheme. When the degradation information (DEG) is in the range from the second reference value (REF2) to the third reference value (REFS), the degradation information (DEG) may correspond to a clock frequency (F2) and the SDR scheme. When the degradation information (DEG) is in the range from the reference value (REFm) to the reference value (REFm+1), the degradation information (DEG) may correspond to a clock frequency (Fm) and the SDR scheme. When the degradation information (DEG) is in the range from the reference value (REFk−1) to the reference value (REFk), the degradation information (DEG) may correspond to a clock frequency (Fk−1) and the SDR scheme.

The comparison signal (CMP) may have the number of bits corresponding to the range of reference values. That is, the comparison signal (CMP) may have k−1 bits. When the degradation information (DEG) is in the range from the reference value (REFm) to the reference value (REFm+1), the comparator 1110 (representing 1110_1 to 1110_n) of the operation speed controller 1100 may activate only the bit (CMP<m>) of the comparison signal, and may deactivate bits (CMP<0> to CMP<m−1> and CMP<m+1> to CMP<k−1>) of the remaining comparison signals. The clock controller 1120 (representing 1120_1 to 1120_n) may set the operation frequency (CLK) of the semiconductor device 20 to a specific frequency (Fm), and may set an operation control signal (OP_CTRL) to a specific value corresponding to the SDR scheme.

The operation speed controller 1100 may reduce the operation frequency of the semiconductor device (one of the semiconductor devices 20_1 to 20_N) in proportion to the corresponding degradation information (DEG) increase. In addition, when the degradation information (DEG) is higher than a predetermined value, the operation speed controller 1100 may control one of the semiconductor devices 20_1 to 20_N to operate according to the SDR scheme. When the degradation information (DEG) is not higher than the predetermined value, the operation speed controller 1100 may control one of the semiconductor devices 20_1 to 20_N to operate according to the DDR scheme. For example, as shown in FIG. 6, the reference value may increase in the order of REF1→REF2→REF3→REFm→REFm+1→REFk−1→REFk, and the operation frequency may decrease in the order of F1→F2→F3→Fm→Fm+1→Fk−→Fk.

FIG. 6 illustrates an exemplary method for controlling the operation frequency and the operation scheme on the basis of the degradation information (DEG). However, it should be noted that the operation frequency and the operation scheme may be controlled in various other ways consistent with this disclosure.

Figure 7:
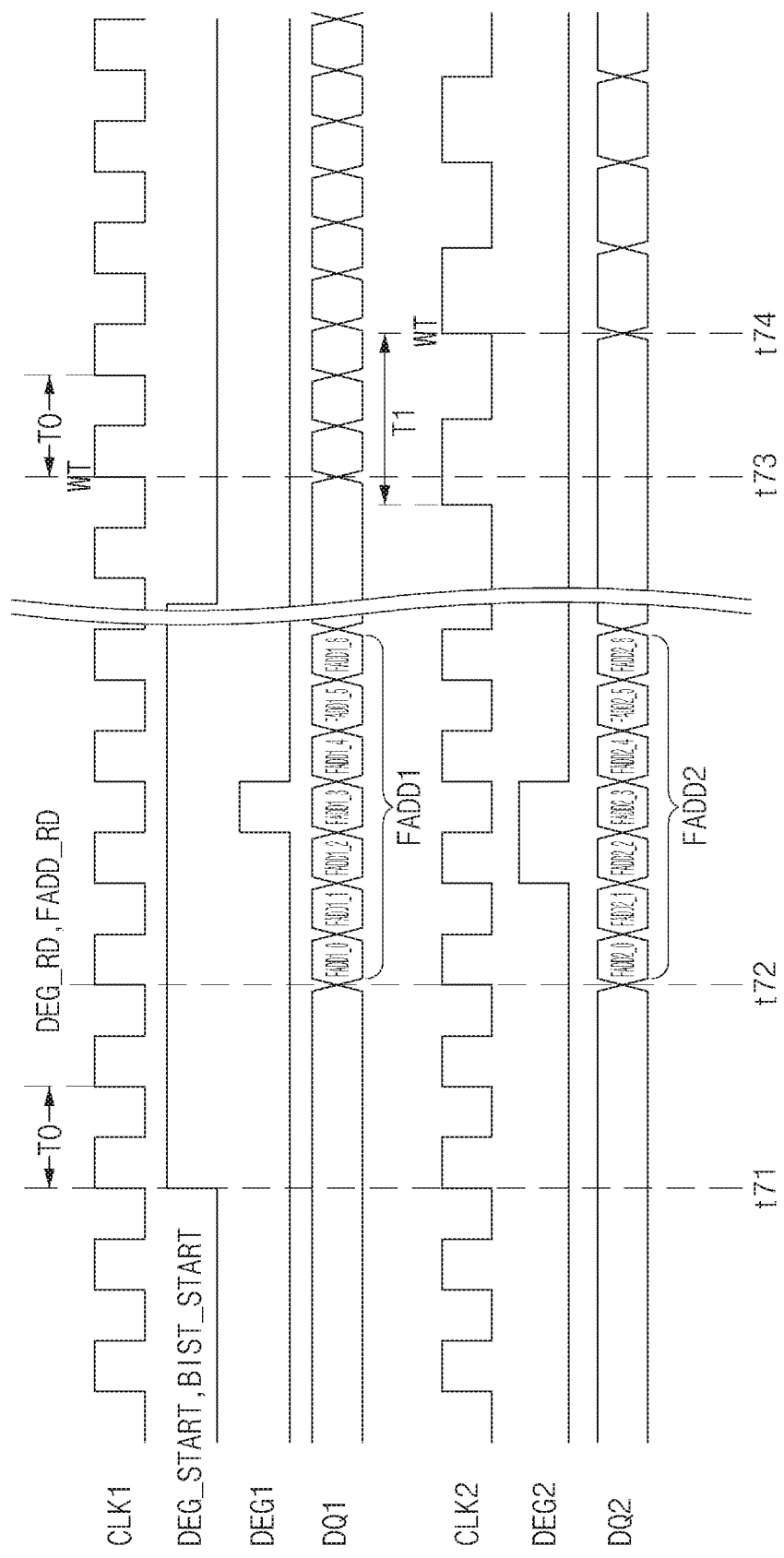
FIG. 7 is a timing diagram illustrating signals according to an embodiment of the present disclosure.

FIG. 7 is a timing diagram illustrating signals according to an embodiment of the present disclosure. In FIG. 7, for conciseness and illustrative purpose, it is assumed that the semiconductor system 1 includes two semiconductor devices 20_1 and 20_2, as an example.

It is also assumed that the degradation detection start signal (DEG_START), the self-test start signal (BIST_START), the degradation read signal (DEG_RD), and the failed address read signal (FADD_RD) are commonly applied to two semiconductor devices 20_1 and 20_2. In addition, it is assumed that the degradation detection start signal (DEG_START) and the self-test start signal (BIST_START) are simultaneously applied to two semiconductor devices 20_1 and 20_2, and the degradation read signal (DEG_RD) and the failed address read signal (FADD_RD) are simultaneously applied to two semiconductor devices 20_1 and 20_2. However, the scope of the present disclosure is not limited thereto; each of the degradation detection start signal (DEG_START), the self-test start signal (BIST_START), the degradation read signal (DEG_RD), and the failed address read signal (FADD_RD) may be independently applied to the semiconductor devices 20_1 and 20_2. The degradation detection start signal (DEG_START) and the self-test start signal (BIST_START) respectively applied to the semiconductor devices 20_1 and 20_2 may be activated at different time points. The degradation read signal (DEG_RD) and the failed address read signal (FADD_RD) may also be applied to the semiconductor devices 20_1 and 20_2 at different time points.

Referring to FIG. 7, the degradation detection start signal (DEG_START) and the self-test start signal (BIST_START) may be activated at a time point 't71'. Therefore, the degradation detectors 200_1 and 200_2 (each of which corresponds to 200 of FIG. 2) respectively contained in the semiconductor devices 20_1 and 20_2 may respectively generate degradation information DEG1 and DEG2. In addition, the failed address detectors 300_1 and 300_2 (each of which corresponds to 300 of FIG. 2) respectively contained in the semiconductor devices 20_1 and 20_2 may respectively detect failed addresses FADD1 and FADD2.

At a time point 't72', the degradation read signal (DEG_RD) and the failed address read signal (FADD_RD) may be applied to the semiconductor devices 20_1 and 20_2. In this example, it may be assumed that the semiconductor devices 20_1 and 20_2 output data according to the DDR and serial scheme. However, the scope of the present disclosure is not limited thereto; the semiconductor devices 20_1 and 20_2 may output data according to the SDR scheme or may use a parallel scheme in which the degradation information DEG1 or DEG2 having a plurality of bits is transmitted through a plurality of data transmission lines. The degradation detector 200_1 of the semiconductor device 20_1 may begin to output the degradation information (DEG_1) in response to the degradation read signal (DEG_RD). That is, the degradation information (DEG1) denoted by '0001' may be output after a predetermined time passes from a time point 't72'. At the time point 't72', the degradation detector 200_2 of the semiconductor device 20_2 may begin to output the degradation information (DEG2). That is, the degradation information (DEG2) denoted by '0011' may be output after a predetermined time passes from the time point 't72'. In addition, the failed address detector 300_1 of the semiconductor device 20_1 may output the failed address (FADD1) or the failed addresses (FADD1_0 to FADD1_6) in response to the failed address read signal (FADD_RD), and the failed address detector 300_2 of the semiconductor device 20_2 may begin to output the failed address (FADD2) or the failed addresses (FADD2_0 to FADD2_6) in response to the failed address read signal (FADD_RD).

In an embodiment of the present disclosure the operation speed controller 1100 of the semiconductor control device 10 may set the operation frequency to a value of '1/T0' when each of the degradation information DEG1 and DEG2 is less than a reference value '0010', and may also set the operation frequency to '1/T1' (where T0<T1) when each of the degradation information DEG1 and DEG2 is higher than the reference value '0010'.

At a time point 't73', the semiconductor device 20_1 may still operate at the operation frequency of '1/T0'. However, the operation frequency of the semiconductor device 20_2 may be changed to a value of '1/T1'. That is, since the degradation information DEG2 is higher than the reference value '0010', the operation speed of the semiconductor device 20_2 may be changed to a slow speed.

Figure 8:
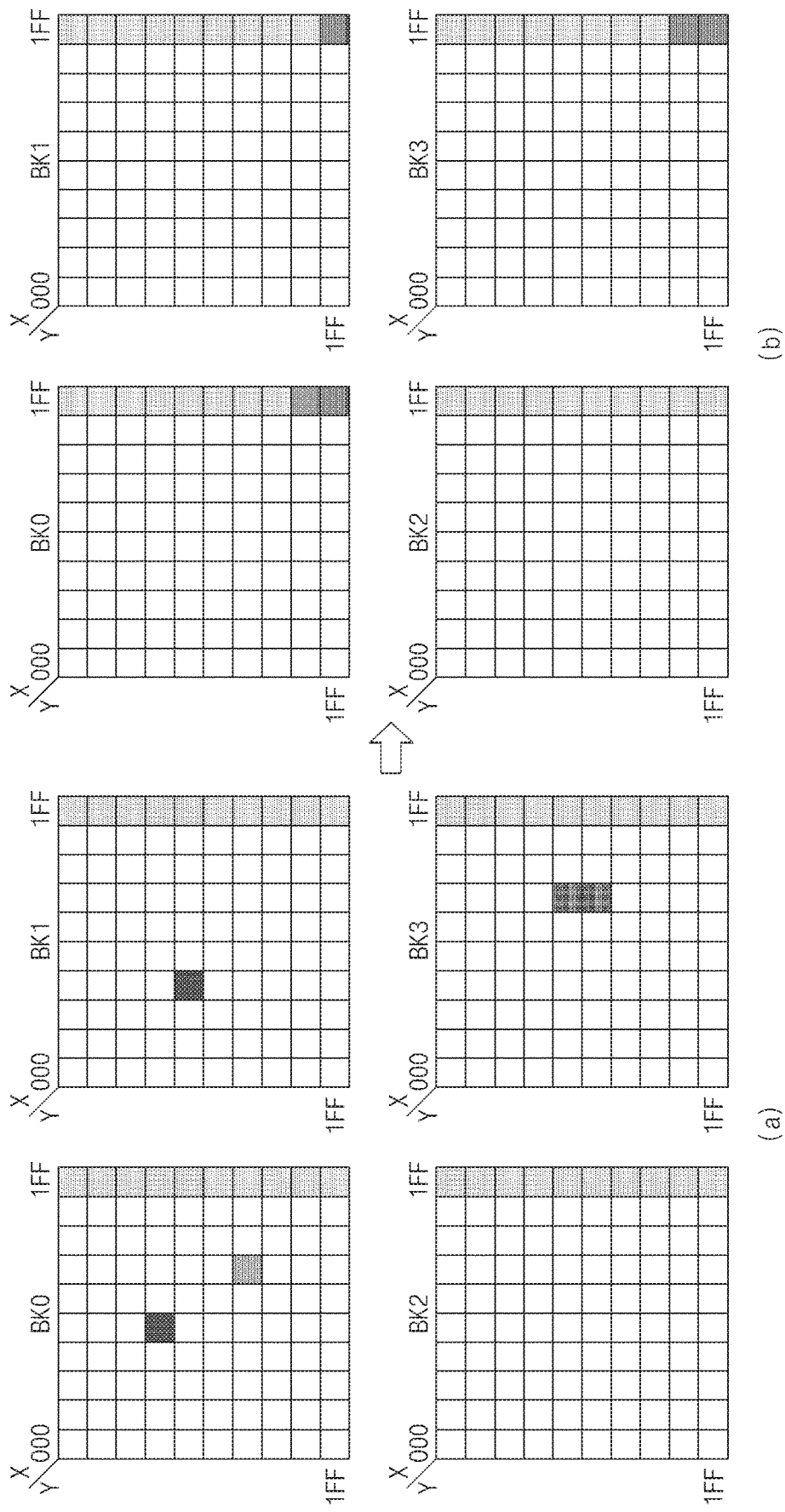
FIG. 8 illustrates operations of a memory allocation circuit of the semiconductor control device according to an embodiment of the present disclosure.

FIG. 8 illustrates operations of the memory allocation circuit 1200 of the semiconductor control device 10 according to an embodiment of the present disclosure. That is, FIG. 8 illustrates the memory region 21.

Referring to FIG. 8, the memory region 21 may include four banks BK0 to BK3. Each of the banks BK0 to BK3 may operate as an independent channel. That is, while the semiconductor control device 10 gains access to at least one of the banks BK0 to BK3, the semiconductor control device 10 may also access the remaining banks BK0 to BK3.

Each of the banks BK0 to BK3 may include a plurality of memory cells arranged in a lattice shape. In each of the banks BK0 to BK3, numerals on an X-axis may denote row addresses, and numerals on a Y-axis may denote column addresses. It is assumed that the regions of the rightmost columns corresponding to the column addresses having a value of '1FFXXX' are inaccessible regions in the respective banks BK0 to BK3.

The memory allocation circuit 1200 may match a region corresponding to the failed address (FADD) to the inaccessible region. In (a) of FIG. 8, each dark gray region may denote a memory cell corresponding to the failed address (FADD). In (b) of FIG. 8, each dark gray region is located in the inaccessible region. In this way, the memory allocation circuit 1200 may match the failed address (FADD) to a memory cell of the inaccessible region, and may thus prevent access to the storage region corresponding to the failed address (FADD).

Figure 9:
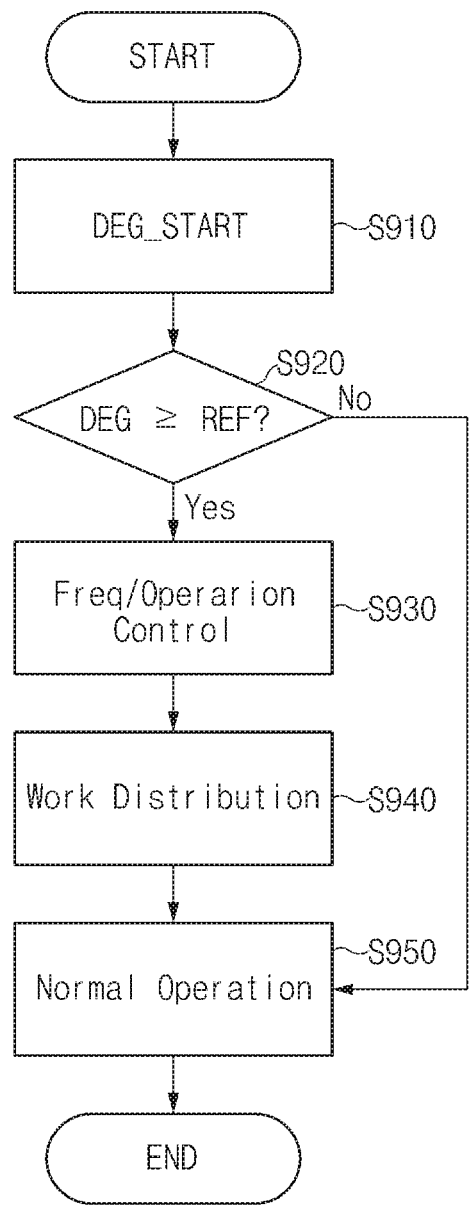
FIG. 9 is a flowchart describing operations of the semiconductor system associated with degradation detection according to an embodiment of the present disclosure.

FIG. 9 is a flowchart describing operations of the semiconductor system 1 associated with degradation detection according to an embodiment of the present disclosure.

Referring to FIG. 9, the semiconductor control device 10 may activate the degradation detection start signal (DEG_START) in step S910. Therefore, the degradation detector 200 of the semiconductor device 20 may generate the degradation information (DEG). The operation speed controller 1100 of the semiconductor control device 10 may determine whether the degradation information (DEG) is greater than or equal to the reference value (REF) in step S920. When the degradation information (DEG) is greater than or equal to the reference value (REF) (that is, "Yes" in step S920), the operation speed controller 1100 of the semiconductor control device 10 may change the operation frequency and/or the operation scheme of the semiconductor device 20 in step S930.

In addition, the memory allocation circuit 1200 may distribute work to be performed in the semiconductor device 20 on the basis of the changed operation speed in step S940. For example, when the semiconductor system 1 is used in vehicles, such as automobiles, work to be performed in the semiconductor system 1 may be classified into infotainment, Advanced Driver Assistance System (ADAS), telematics, and vehicle control. In this case, the work related to infotainment is less associated with safety, which means that such work may be less sensitive to a data transfer rate. As a result, when the degradation information (DEG) is greater than or equal to the reference value (REF), the memory allocation circuit 1200 may distribute the work corresponding to the infotainment to the semiconductor device 20.

When the degradation information (DEG) is less than the reference value (REF) (that is, "No" in step S920), the operation speed controller 1100 of the semiconductor control device 10 may perform a normal operation in step S950.

Figure 10:
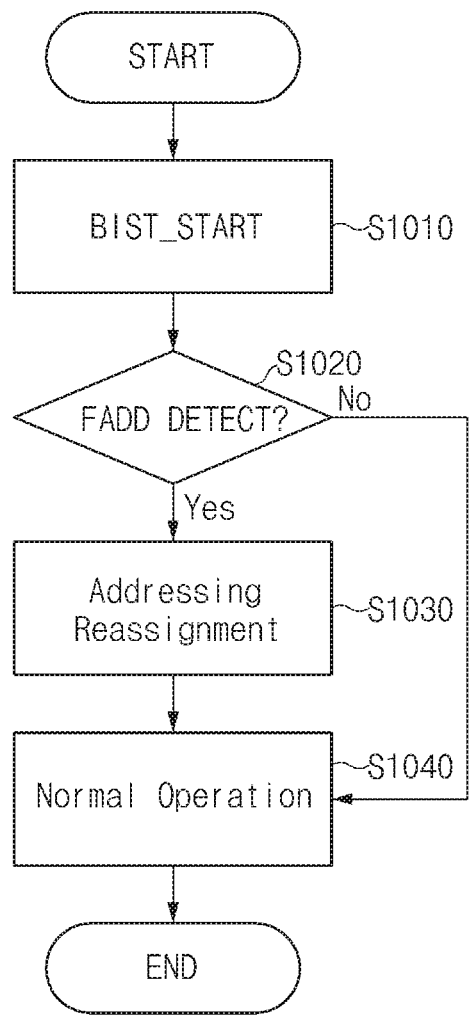
FIG. 10 is a flowchart describing operations of the semiconductor system associated with failed address detection according to an embodiment of the present disclosure.

FIG. 10 is a flowchart describing operations of the semiconductor system 1 associated with failed address detection according to an embodiment of the present disclosure.

Referring to FIG. 10, the semiconductor control device 10 may activate the failed address detection start signal (BIST_START) in step S1010. Therefore, the failed address detector 300 of the semiconductor device 20 may detect the failed address (FADD) in step S1020. When the failed address (FADD) is detected (that is, "Yes" in step S1020), the memory allocation circuit 1200 of the semiconductor control device 10 may perform address reallocation in step S1030 in a manner that a memory cell corresponding to the failed address (FADD) is not accessed. When the failed address (FADD) is not detected (that is, "No" in step S1020), the memory allocation circuit 1200 of the semiconductor control device 10 may perform a normal operation in step S1040.

Figure 11:
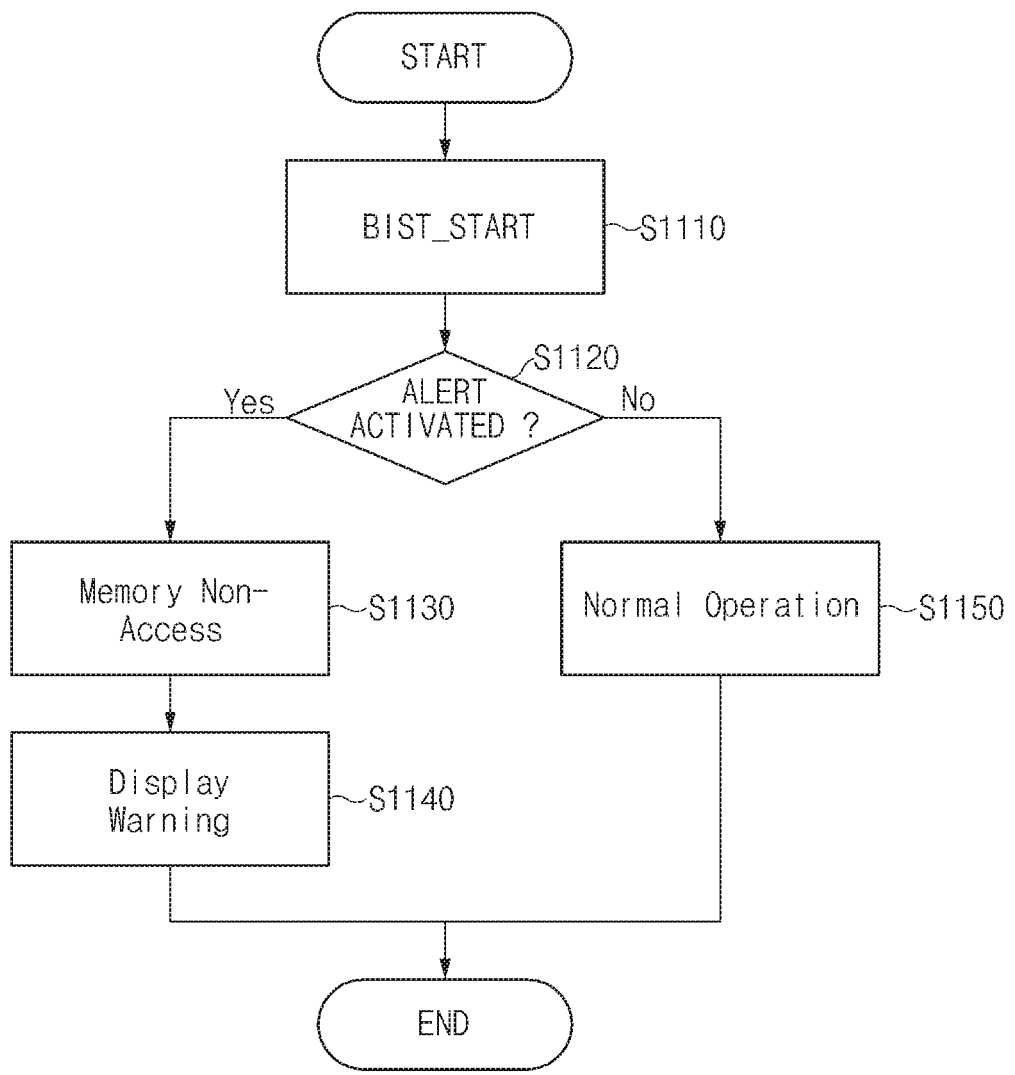
FIG. 11 is a flowchart describing operations of the semiconductor system associated with warning signal detection according to an embodiment of the present disclosure.

FIG. 11 is a flowchart describing operations of the semiconductor system 1 associated with warning signal detection according to an embodiment of the present disclosure.

Referring to FIG. 11, the semiconductor control device 10 may activate the failed address detection start signal (BIST_START) in step S1110. Therefore, the failed address detector 300 of the semiconductor device 20 may detect the failed address (FADD), and may activate the strobe signal (STROBE) whenever the failed address is generated. The warning signal generator 200 may activate the warning signal (ALERT) when the count value of strobe signals (STROBE) is higher than a predetermined value. When the warning signal (ALERT) is activated (that is, "Yes" in step S1120), the memory allocation circuit 1200 of the semiconductor control device 10 may block the semiconductor device 20 so that the semiconductor device 20 is not accessed in step S1130. In addition, when the warning signal (ALERT) is activated, the semiconductor control device 10 may also display a warning message on a display device in step S1140. Therefore, a user of the semiconductor system 1 may recognize the occurrence of an unexpected problem in the semiconductor device 20, and may replace the semiconductor device 20 corresponding to the warning signal (ALERT) with another. When the warning signal (ALERT) is not activated (that is, "No" in step S1120), the memory allocation circuit 1200 of the semiconductor control device 10 may perform a normal operation in step S1150.

The above-mentioned description provides detailed explanation of various embodiments of the invention. The embodiments may include additional structures that are not directly associated with technical ideas of the present invention. In addition, the Active High or Active Low designations for indicating deactivation states of a signal and circuit may be changed. These and other similar modifications will be appreciated by those skilled in the art in light of the foregoing disclosure as being part of the present disclosure.

As is apparent from the above description, embodiments of the present disclosure can ensure or improve reliability of a semiconductor device.

Those skilled in the art will appreciate that the invention may be carried out in ways other than those set forth herein without departing from the spirit and scope of the invention. The above embodiments are therefore to be considered illustrative and not restrictive. The scope of the invention should be determined by the claims, as appended or later amended or added, and their legal equivalents, and not limited by the above description. Further, all changes falling within the scope of the claims are intended to be embraced therein.

Although illustrative embodiments consistent with the invention have been described, it should be understood that numerous other modifications and embodiments can be devised by those skilled in the art in light of the foregoing disclosure that fall within the spirit and scope of the principles of this disclosure. Particularly, numerous variations and modifications of the component parts and/or their arrangements fall within the scope of the disclosure and the accompanying claims. Alternative uses will also be apparent to those skilled in the art.

What is claimed is:

1. A semiconductor system comprising:
    a first semiconductor device having a memory region and a reliability measurement circuit configured to measure reliability for fail of the memory region, the first semiconductor device configured to output the measured reliability information of the memory region; and
    a second semiconductor device configured to control the first semiconductor device based on the reliability information,
    wherein the reliability measurement circuit is configured to output at least one of a failed address of the memory region, degradation information indicating a degree of degradation of the memory region, and a warning signal generated based on the number of the failed address, as the reliability information,
    wherein the second semiconductor device comprises:
    an operation speed controller configured to adjust an operation speed of the first semiconductor device based on the degradation information; and
    a memory allocation circuit configured to reallocate a memory cell of the memory region in response to the failed address, the degradation information, and the warning signal, configured to change the failed address to a memory cell of an inaccessible region, and configured to distribute work corresponding to the first semiconductor device based on the degradation information.

2. The semiconductor system according to claim 1, wherein the reliability measurement circuit includes:
    a failed address detector configured to detect at least one failed address of the memory region, and output the detected at least one failed address as the reliability information.

3. The semiconductor system according to claim 2, wherein:
    the memory region includes an accessible region and the inaccessible region.

4. The semiconductor system according to claim 2, wherein the reliability measurement circuit further includes:
    a warning signal generator configured to generate the warning signal based on the number of the detected at least one failed address, and output the warning signal.

5. The semiconductor system according to claim 4, wherein the second semiconductor device blocks the first semiconductor device based on the warning signal.

6. The semiconductor system according to claim 1, wherein the reliability measurement circuit includes:
    a degradation detector configured to detect the degree of degradation of the memory region based on a degradation detection start signal, and output degradation information.

7. The semiconductor system according to claim 6, wherein the operation speed controller adjusts at least one of an operation frequency of the first semiconductor device and a data transmission scheme based on the degradation information.

8. The semiconductor system according to claim 7, wherein the operation speed controller includes:
    a comparator configured to generate a comparison signal by comparing the degradation information with a reference value; and
    a clock controller configured to control a frequency of a clock signal based on the comparison signal, or generate an operation control signal indicating the data transmission scheme based on the comparison signal.

9. A semiconductor device comprising:
    a memory region; and
    a reliability measurement circuit configured to measure reliability of the memory region, and output the measured reliability information to an external part,
    wherein the reliability measurement circuit comprising:
    a failed address detector configured to detect at least one failed address of the memory region, and output the detected at least one failed address as the reliability information, wherein the failed address detector activates at least one strobe signal whenever each of the at least one failed address is detected;
    a warning signal generator configured to activate a warning signal based on the number of the detected at least one failed address, and output the activated warning signal as the reliability information based on a count value of the at least one strobe signal; and
    a degradation detector configured to detect a degree of degradation of the memory region, and output degradation information, which is indicative of the detected degree of degradation of the memory region, as the reliability information.

10. The semiconductor device according to claim 9, wherein the failed address detector includes:
    a built-in self-test circuit configured to perform a built-in self-test for detecting the at least one failed address of the memory region based on a failed address detection start signal; and
    a failed address storage circuit configured to store the detected at least one failed address, and output the stored at least one failed address based on a failed address read signal.

11. The semiconductor device according to claim 9, wherein the degradation detector includes:

a ring oscillator configured to generate at least one oscillation signal based on a degradation detection start signal; and a degradation information generator configured to generate degradation information based on a count value of the at least one oscillation signal.

12. The semiconductor device according to claim 9, wherein the memory region includes an accessible region and an inaccessible region.

13. The semiconductor device according to claim 9, wherein the failed address detector and the degradation detector respectively perform a failed address detection operation and a degradation detection operation based on a single start signal.

14. A semiconductor system comprising:

a first semiconductor device configured to output at least one of a failed address of a memory region, degradation information indicating a degree of degradation of the memory region, and a warning signal generated based on the number of the failed address, as the reliability information; and a second semiconductor device configured to control the first semiconductor device based on the reliability information, wherein the second semiconductor device comprises;

an operation speed controller configured to adjust an operation speed of the first semiconductor device based on the degradation information; and a memory allocation circuit configured to reallocate a memory cell of the memory region in response to the failed address, the degradation information, and the warning signal, configured to change the failed address to a memory cell of an inaccessible region, and configured to distribute work corresponding to the first semiconductor device based on the degradation information.

15. The semiconductor system according to claim 14, wherein the memory region includes an accessible region and the inaccessible region.

16. The semiconductor system according to claim 14, wherein the first semiconductor device comprising;

a failed address detector configured to detect at least one failed address of the memory region, and output the detected at least one failed address to an external part, as the reliability information, wherein the failed address detector activates at least one strobe signal whenever each of the at least one failed address is detected;

a warning signal generator configured to generate a warning signal based on the number of the at least one failed address, and output the warning signal to an external part, as the reliability information, wherein the warning signal generator activates the warning signal based on a count value of the at least one strobe signal; and a degradation detector configured to detect a degree of degradation of the memory region, and output degradation information, which is indicative of the detected degree of degradation of the memory region, to an external part, as the reliability information.

17. The semiconductor system according to claim 16, wherein the failed address detector includes:

a built-in self-test circuit configured to perform a built-in self-test for detecting the at least one failed address of the memory region based on a failed address detection start signal; and a failed address storage circuit configured to store the detected at least one failed address, and output the stored at least one failed address based on a failed address read signal.

18. The semiconductor system according to claim 16, wherein the failed address detector and the degradation detector respectively perform a failed address detection operation and a degradation detection operation based on a single start signal.

19. The semiconductor system according to claim 16, wherein the degradation detector includes a ring oscillator configured to generate at least one oscillation signal based on a degradation detection start signal.

20. The semiconductor system according to claim 19, wherein the degradation detector includes a degradation information generator configured to generate degradation information based on a count value of the at least one oscillation signal.

* * * * *